US00RE41248E

(19) United States
(12) Reissued Patent
Palmqvist et al.

(10) Patent Number: US RE41,248 E
(45) Date of Reissued Patent: Apr. 20, 2010

(54) METHOD OF MAKING CEMENTED CARBIDE INSERT

(75) Inventors: Lisa Palmqvist, Goteberg (SE); Mikael Lindholm, Hagersten (SE); Anders Lenander, Tyresö (SE); Bjorn Ljungberg, Enskede (SE); Michael Thysell, Stockholm (SE)

(73) Assignee: Sanvik Intellectual Property Aktiebolag, Sandviken (SE)

(21) Appl. No.: 11/484,831

(22) Filed: Jul. 12, 2006

Related U.S. Patent Documents

Reissue of:
(64) Patent No.: 6,699,526
Issued: Mar. 2, 2004
Appl. No.: 09/973,809
Filed: Oct. 11, 2001

U.S. Applications:

(62) Division of application No. 09/496,200, filed on Feb. 2, 2000, now Pat. No. 6,333,100.

(51) Int. Cl.
*C23C 16/36* (2006.01)

(52) U.S. Cl. ..... 427/249.19; 427/203; 427/205; 427/376.1

(58) Field of Classification Search ..... 427/249.19, 427/203, 205, 376.1
See application file for complete search history.

(56) References Cited

U.S. PATENT DOCUMENTS 5,336,292 A * 8/1994 Weinl et al. ..... 75/230
5,484,468 A * 1/1996 Ostlund et al. ..... 75/236
5,549,980 A * 8/1996 Ostlund et al. ..... 428/698
5,643,658 A * 7/1997 Uchino et al. ..... 428/216
5,654,035 A * 8/1997 Ljungberg et al. ..... 427/255.34
5,674,564 A * 10/1997 Ljungberg et al. ..... 427/255.34
5,702,808 A * 12/1997 Ljungberg ..... 428/216
5,729,823 A * 3/1998 Gustafson et al. ..... 428/552
5,766,782 A * 6/1998 Ljungberg ..... 428/698
5,786,069 A * 7/1998 Ljungberg et al. ..... 428/216
5,851,210 A * 12/1998 Torossian ..... 606/108
5,863,640 A * 1/1999 Ljungberg et al. ..... 428/216
6,210,632 B1 * 4/2001 Ostlund et al. ..... 419/15
6,326,093 B1 * 12/2001 Lindholm et al. ..... 428/699
6,468,680 B1 * 10/2002 Waldenstrom et al. ..... 428/698
6,616,970 B2 * 9/2003 Lenander et al. ..... 427/249.19
RE39,814 E * 9/2007 Lindholm et al. ..... 428/699

FOREIGN PATENT DOCUMENTS

EP 0737756 * 10/1996
EP 0753603 * 1/1997
WO 97/09463 3/1997
WO WO 97/09463 * 3/1997
WO 98/03691 1/1998
WO WO 98/03691 * 1/1998
WO 98/16665 4/1998
WO WO 98/16665 * 4/1998

* cited by examiner

*Primary Examiner*—Bret Chen
(74) *Attorney, Agent, or Firm*—Drinker Biddle & Reath LLP

(57) ABSTRACT

A method of making a cutting insert includes forming a powder mixture containing WC, 2–10 wt % Co, 4–12 wt % cubic carbides, adding N in an amount of 0.9–1.7% of the weight of the cubic carbides, mixing the powder with a pressing agent, milling and spray drying the mixture, compacting and sintering the material at 1300–1500 in an atmosphere of sintering gas 40–60 mbar, applying post-sintering treatment, and applying a coating by CVD or MTCVD.

12 Claims, 1 Drawing Sheet

METHOD OF MAKING CEMENTED CARBIDE INSERT

Matter enclosed in heavy brackets [ ] appears in the original patent but forms no part of this reissue specification; matter printed in italics indicates the additions made by reissue.

*CROSS-REFERENCES TO RELATED APPLICATIONS*

*The present application is a reissue of U.S. Pat. No. 6,699,526 B2, filed on Oct. 11, 2001, which is a divisional application of U.S. Pat. No. 6,333,100, filed on Feb. 2, 2000, which claims the benefit of priority of Swedish Application No. 9900403-8, filed Feb. 5, 1999.*

This application is a divisional of application Ser. No. 09/496,200, filed on Feb. 2, 2000, now U.S. Pat. No. 6,333,100 which issued on Dec. 25, 2001.

BACKGROUND OF THE INVENTION

The present invention relates to a coated cutting tool insert particularly useful for turning of steel, like low alloyed steels, carbon steel and tough hardened steels, at high cutting speeds.

High performance cutting tools must nowadays possess high wear resistance, high toughness properties and good resistance to plastic deformation. This is particularly so when the cutting operation is carried out at very high cutting speeds and/or at high feed rates when large amount of heat is generated.

Improved resistance to plastic deformation of a cutting insert can be obtained by decreasing the WC grain size and/or by lowering the overall binder phase content, but such changes will simultaneously result in significant loss in the toughness of the insert.

Methods to improve the toughness behaviour by introducing a thick essentially cubic carbide free and binder phase enriched surface zone with a thickness of about 20–40 μm on the inserts by so called gradient sintering techniques are in the art.

However, these methods produce a rather hard cutting edge due to a depletion of binder phase and enrichment of cubic phases along the cutting edge. A hard cutting edge is more prone to chipping. Nevertheless, such carbide inserts with essentially cubic carbide free and binder phase enriched surface zones are extensively used today for machining steel and stainless steel.

There are ways to overcome the problem with edge brittleness by controlling the carbide composition along the cutting edge by employing special sintering techniques or by using certain alloying elements, of which U.S. Pat. No. 5,484,468, U.S. Pat. No. 5,549,980, U.S. Pat. No. 5,729,823 and U.S. Pat. No. 5,643,658 are illustrated.

All these techniques give a binder phase enrichment in the outermost region of the edge. However, inserts produced according to these techniques often obtain micro plastic deformation at the outermost part of the cutting edge. In particular, this often occurs when the machining is carried out at high cutting speeds. A micro plastic deformation of the cutting edge will cause a rapid flank wear and hence a shortened lifetime of the cutting inserts. A further drawback of the above-mentioned techniques is that they are complex and difficult to fully control.

U.S. Pat. No. 5,786,069 and U.S. Pat. No. 5,863,640 disclose coated cutting tool inserts with a binder phase enriched surface zone and a highly W-alloyed binder phase.

SUMMARY

The present invention provide a cutting tool insert for machining steel, including a cemented carbide body and a coating, wherein: the cemented carbide body includes WC, 2–10 wt. % of Co, 4–12 wt. % of cubic carbides of metals from groups 4, 5 or 6 of the periodic table, and N in an amount of between 0.9 and 1.7% of the weight of the elements from groups 4 and 5; the cemented carbide body includes a Co-binder phase which is highly alloyed with W, and has a CW-ratio of 0.75–0.90; the cemented carbide body has a surface zone with a thickness of <20 μm, which is binder phase enriched and essentially cubic carbide free; the cemented carbide body has a cutting edge which has a binder phase content which is 0.65–0.75 of the bulk binder phase content, and the binder phase content increases at a constant rate along a line which bisects said cutting edge, until it reaches the bulk binder phase content at a distance between 100 and 300 μm from the cutting edge; and the coating includes a 3–12 μm columnar TiCN layer followed by a 2–12 μm $Al_2O_3$ layer, possibly with an outermost 0.5–4 μm TiN layer.

The present invention also provides a method of making a cutting insert comprising a cemented carbide body having a binder phase, with a binder phase enriched surface zone and a binder phase depleted cutting edge, and a coating, including the steps of: forming a powder mixture including WC, 2–10 wt. % Co, 4–12 wt. % of cubic carbides of metals from groups 4, 5 or 6 of the periodic table, the binder phase having a CW-ratio of 0.75–0.90; adding N in an amount of between 0.9 and 1.7% of the weight of the elements from groups 4 and 5; mixing the powder with a pressing agent; milling and spray drying the mixture to a powder material compacting and sintering the powder material at a temperature of 1300–1500° C., in a controlled atmosphere of sintering gas at 40–60 mbar followed by cooling; applying post-sintering treatment; and applying a hard, wear resistant coating by CVD or MT-CVD-technique.

DETAILED DESCRIPTION OF THE EMBODIMENTS

Figure 1:
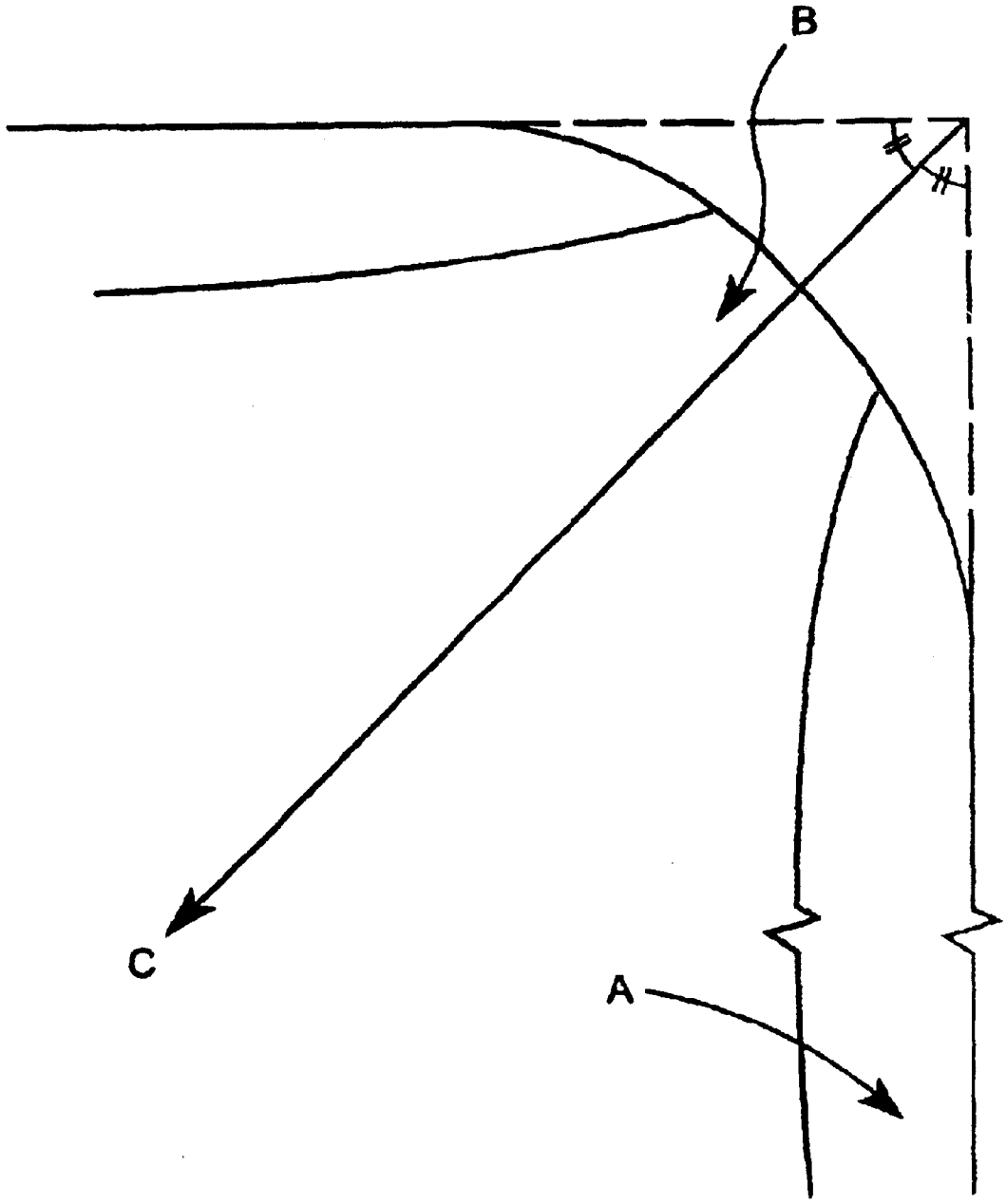
FIG. 1 is a schematic drawing of a cross section of an edge of an insert gradient sintered according to the present invention.

It has now surprisingly been found that significant improvements with respect to resistance to plastic deformation and toughness behaviour can simultaneously be obtained for a cemented carbide insert if a number of features are combined. The improvement in cutting performance of the cemented carbide inserts can be obtained if the cobalt binder phase is highly alloyed with W, if the essentially cubic carbide free and binder phase enriched surface zone A has a certain thickness and composition, fi the cubic carbide composition near the cutting edge B is optimised and if the insert is coated with a 3–12 μm columnar TiCN-layer followed by a 2–12 μm thick $Al_2O_3$ layer, for example produced according to any of the patents U.S. Pat. No. 5,766,782, U.S. Pat. No. 5,654,035, U.S. Pat. No. 5,674,564 or U.S. Pat. No. 5,702,808, possibly with an outermost 0.5–4 μm TiN-layer. The $Al_2O_3$-layer will serve as an effective thermal barrier during cutting and thereby improve not only the resistance to plastic deformation which is a heat influenced property but also increases the crater wear resistance of the cemented carbide insert. In addition, if the coating along the cutting edge is smoothed by an appropriate technique, like by brushing with a SiC-based nylon brush or by a gentle blasting with $Al_2O_3$ grains, the cutting performance can be enhanced further, in particular with respect to flaking resistance of the coating (see, e.g. U.S. Pat. No. 5,851,210).

Said cutting insert possess excellent cutting performance when machining steel at high cutting-speeds, in particular low alloyed steels, carbon steels and tough hardened steels. As a result a wider application area for the coated carbide insert is obtained because the cemented carbide insert according to the invention performs very well at both low and very high cutting speeds under both continuous and intermittent cutting conditions.

The coated cemented carbide insert of the invention has a <20 μm, preferably 5–15 μm, thick essentially cubic carbide free and binder phase enriched surface zone A (FIG. 1), preferably with an average binder phase content (by volume) of 1.2–3.0 times the bulk binder phase content. In order to obtain high resistance to plastic deformation but simultaneously avoid a brittle cutting edge the chemical composition is optimised in zone B (FIG. 1). Along line C (FIG. 1), in the direction from edge to the centre of the insert, the binder phase content increases essentially constantly until it reaches the bulk composition. At the edge the binder phase content by volume is 0.65–0.75, preferably about 0.7 times the binder phase content of the bulk. In a similar way, the cubic carbide phase content decreases along line C, preferably from about 1.3 times the content of the bulk. The depth of the binder phase depletion and cubic carbide enrichment along line C is 100–300 μm, preferably 150–250 μm.

The binder phase is highly W-alloyed. The content of W in the binder phase can be expressed as a CW-ratio=$M_s$/(wt. % Co*0.0161) where $M_s$ is the measured saturation magnetisation of the cemented carbide body in [kA/m] $hAm^2/kg$ and wt-% Co is the weight percentage of Co in the cemented carbide. The CW-ratio takes a value ≦1 and the lower the CW-ratio, the higher is the W-content in the binder phase. It has now been found according to the invention that an improved cutting performance is achieved if the CW-ratio is 0.75–0.90, preferably 0.80–0.85.

Inserts according to the invention are further provided with a coating consisting of essentially 3–12 μm columnar TiCN-layer followed by a 2–12 μm thick $Al_2O_3$-layer deposited, for example according to any of the patients U.S. Pat. No. 5,766,782, U.S. Pat. No. 5,654,035, U.S. Pat. No. 5,674,564, U.S. Pat. No. 5,702,808 preferably with an $\alpha$-$Al_2O_3$-layer, possibly with an outermost 0.5–4 μm TiN-layer.

The present invention is applicable to cemented carbides with a composition of 2–10, preferably 4–7, weight percent of binder phase consisting of Co, and 4–12, preferably 7–10, weight percent curbic carbides of the metals from groups 4, 5 or 6 of the periodic table, preferably >1 wt. % of each Ti, Ta and Nb and a balance WC. The WC preferably has an average grain size of 1.0 to 4.0 μm, more preferably 2.0 to 3.0 μm. The cemented carbide body may contain small amounts, <1 volume %, of $\eta$-phase ($M_6C$).

By applying layers with different thicknesses on the cemented carbide body according to the invention, the property of the coated insert can be optimised to suit specific cutting conditions. In one embodiment, a cemented carbide insert produced according to the invention is provided with a coating of: 6 μm TiCN, 8 μm $Al_2O_3$ and 2 μm TiN. This coated insert is particularly suited for cutting operation with high demand regarding crater wear. In another embodiment, a cemented carbide insert produced according to invention is provided with a coating of: 8 μm TiCN, 4 μm $Al_2O_3$ and 2 μm TiN. This coating is particularly suited for cutting operations with high demands on flank wear resistance.

The invention also relates to a method of making cutting inserts comprising a cemented carbide substrate consisting of a binder phase of Co, WC and a cubic carbonitride phase with a binder phase enriched surface zone essentially free of cubic phase and a coating. The powder mixture consists 2–10, preferably 4–7, weight percent of binder phase consisting of Co, and 4–12, preferably 7–10, weight percent cubic carbides of the metals from groups 4, 5 or 6 of the periodic table, preferably >1 wt. % of each Ti, Ta and Nb and a balance WC, preferably with an average grain size of 1.0–4.0 μm, more preferably 2.0–3.0 μm. Well-controlled amounts of nitrogen are added either through the powder as carbonitrides and/or added during the sintering process via the sintering gas atmosphere. The amount of added nitrogen will determine the rate of dissolution of the cubic phases during the sintering process and hence determine the overall distribution of the elements in the cemented carbide after solidification. The optimum amount of nitrogen to be added depends on the composition of the cemented carbide and in particular on the amount of cubic phases and varies between 0.9 and 1.7%, preferably about 1.1–1.4%, of the weight of the elements from groups 4 and 5 of the periodic table. The exact conditions depend to a certain extent on the design of the sintering equipment being used. It is within the purview of the skilled artisan to determine whether the requisite surface zones A and B of cemented carbide have been obtained and to modify the nitrogen addition and the sintering process in accordance with the present specification in order to obtain the desired result.

The raw materials are mixed with pressing agent and possibly W such that the desired CW-ratio of the binder phase is obtained and the mixture is milled and spray dried to obtain a powder material with the desired properties. Next, the powder material is compacted and sintered. Sintering is performed at a temperature of 1300–1500° C., in a controlled atmosphere of between 40 and 60 mbar, preferably about 50 mbar, followed by cooling. After conventional post sintering treatments including edge rounding a hard, wear resistant coating, such as defined above, is applied by CVC- or MT-CVD-technique.

EXAMPLE 1

A.) Cemented carbide turning inserts of the style C N M G 1 2 0 4 0 8 - P M, D N M G 1 5 0 6 1 2 - P M and CNMG160616-PR, with the composition 5.5 wt. % Co, 3.5 wt. % TaC, 2.3 wt. % NbC, 2.1 wt. % TiC and 0.4 wt. % TiN and balance WC with an average grain size of 2.5 μm were produced according to the invention. The nitrogen was added to the carbide powder as TiCN. Sintering was done at 1450° C. in a controlled atmosphere consisting of Ar, CO and some $N_2$ at a total pressure of about 50 mbar.

Metallographic investigation showed that the produced cemented carbide inserts had a cubic-carbide-free zone A with a thickness of 10 μm. Image analysis technique was used to determine the phase composition at zone B and the area along line C (FIG. 1). The measurements were done on polished cross sections of the inserts over an area of approx. 40×40 μm gradually moving along the line C. The phase composition was determined as volume fractions. The analysis showed that the cobalt content in zone B was 0.7 times the bulk cobalt cement and the cubic carbide content 1.3 times the bulk gamma phase content. The measurements of the bulk content were also done by image analysis technique. The Co-content was gradually increasing and the cubic carbide content gradually decreasing along line C in the direction from the edge to the centre of the insert.

Magnetic saturation values were recorded and used for calculating CW-values. An average CW-value of 0.84 was obtained.

B.) Inserts from A were first coated with a thin layer <1 μm of TiN followed by 6 μm thick layer of TiCN with columnar grains by using MT-CVD-techniques (process temperature 850° C. and $CH_3CN$ as the carbon/nitrogen source). In a subsequent process step during the same coating cycle, an 8 μm thick $\alpha$-$Al_2O_3$ layer was deposited according to patent U.S. Pat. No. 5,654,035. On top of the $\alpha$-$Al_2O_3$ layer a 1.5 μm TiN layer was deposited.

C.) Inserts from A were first coated by a thin layer <1 μm of TiN followed by a 9 μm thick TiCN-layer and a 5 μm thick $\alpha$-$Al_2O_3$ layer and a 2 μthick TiN layer on top. The same coating procedures as given in A.) were used.

D.) Commercially available cutting insert in style C N M G 1 2 0 4 0 8 - P M, D N M G 1 5 0 6 1 2 - P M and CNMG160616-PR, with the composition given below were used as references in the cutting tests:

Composition: Co=5.5 wt. %, TaC=5.5 wt. %, NbC=2.3 wt. %, TiC=2.6 wt. % and balance WC with a grain size 2.6 μm. Cobalt enriched gradient zone: none CW-ratio: >0.95

Coating: 8 μm TiCN, 6 μm, $Al_2O_3$, 0.5 μm TiN on top

E.) Inserts with the same cemented carbide composition as in D were coated with a 4 μm TiN and 6 μm $Al_2O_3$. Inserts styles CNMG120408-QM and CNMG120412-MR.

F.) Inserts in styles C N M G 1 2 0 4 0 8 - Q M and CNMG120412-MR with the composition: 4.7 wt. % Co, 3.1 Wt. % TaC, 2.0 wt. % NbC, 3.4 wt. %, TiC 0.2 wt. % N and rest WC with a grain size of 2.5 μm were produced. The inserts were sintered according to the method described in patent U.S. Pat. No. 5,484,468, i.e., a method that gives cobalt enrichment in zone B. The sintered carbide inserts had a 25 μm thick gradient zone essentially free from cubic carbide. The inserts were coated with the same coating as in E.

EXAMPLE 2

Inserts from B and C of Example 1 were tested and compared with inserts from D with respect to toughness in a longitudinal turning operation with interrupted cuts.

Material: Carbon steel SS1312.

| Cutting data: | |
|---|---|
| Cutting speed = | 140 m/min |
| Depth of cut = | 2.0 mm |
| Feed = | Starting with 0.12 mm and gradually increased by 0.08 mm/min until breakage of the edge |

15 edges of each variant were tested

Insert style: CNMG120408-PM

| Results: | mean feed at breakage |
|---|---|
| Inserts B | 0.23 mm/rev |
| Inserts C | 0.23 mm/rev |
| Inserts D | 0.18 mm/rev |

EXAMPLE 3

Inserts from B, C and D of Example 1 were tested with respect to resistance to plastic deformation in longitudinal turning of alloyed steel (AISI 4340).

| Cutting data: | |
|---|---|
| Cutting speed = | 160 m/min |
| Feed = | 0.7 mm/rev. |
| Depth of cut = | 2 mm |
| Time in cut = | 0.50 min |

The plastic deformation was measured as the edge depression at the nose of the inserts.

| Results: | Edge depression, μm |
|---|---|
| Insert B | 43 |
| Insert C | 44 |
| Insert D | 75 |

Examples 2 and 3 show that the inserts B and C according to the invention exhibit much better plastic deformation resistance in combination with somewhat better toughness behaviour in comparison to the inserts D according to prior art.

EXAMPLE 4

Inserts from E and F of Example 1 were tested with respect to flank wear resistance in longitudinal turning of ball bearing steel SKF25B.

| Cutting data: | |
|---|---|
| Cutting speed: | 320 m/min |
| Feed: | 0.3 mm/rev. |
| Depth of cut: | 2 mm |

Tool life criteria: Flank wear >0.3 mm

| Results: | Tool life |
|---|---|
| Insert E | 8 min |
| Insert F | 6 min |

Variant F exhibited micro plastic deformation resulting in more rapid development of the flank wear.

EXAMPLE 5

Inserts from E and F of Example 1 in inserts style CNMG120412-MR were tested at an end-user in machining of a steel casting component.

| Cutting data: | |
|---|---|
| Cutting speed: | 170-180 m/min |
| Feed: | 0.18 mm/rev. |
| Depth of cut: | 3 mm |

The component had the shape of a ring. The inserts machined two components each and the total time in cut was 13.2 min.

After the test the flank wear of the inserts were measured.

| Results: | Flank wear |
|---|---|
| Insert E | 0.32 mm |
| Insert F | 0.60 mm |

Example 4 and 5 illustrate the detrimental effect of cobalt enrichment in the edge area B typical for inserts produced by prior art gradient sintering technique as described in e.g. U.S. Pat. No. 5,484,468.

EXAMPLE 6

Inserts from B and D from Example 1 were tested under the same condition as in Example 4. Inserts style CNMG120408-PM.

| Cutting data: | |
|---|---|
| Cutting speed: | 320 m/min |
| Feed: | 0.3 mm/rev. |
| Depth of cut: | 2 mm |

Tool life criteria: Flank wear >0.3 mm

| Results: | Tool life |
|---|---|
| Insert B | 8 min |
| Insert D | 8 min |

EXAMPLE 7

Inserts from B and D of Example 1 were tested at an end user in the machining of cardan shafts in tough hardened steel. Insert style DNMG150612-PM.

| Cutting condition: | |
|---|---|
| Cutting speed: | 150 m/min |
| Feed: | 0.3 mm/rev. |
| Depth of cut: | 3 mm |

The inserts machined 50 component each. Afterwards the flank wear of the inserts was measured.

| Results: | Flank wear |
|---|---|
| Insert B | 0.15 mm |
| Insert D | 0.30 mm |

Examples 6 and 7 illustrate that inserts with an optimised edge zone composition according to the invention do not suffer from micro plastic deformation and hence no rapid flank wear as prior art gradient sintered insert F does (see examples 4 and 5).

EXAMPLE 8

In a test performed at an end-user inserts from B, C and D in Example 1 in style CNMG160616-PR were run in a longitudinal turning operation in machining of crankshaft in low alloyed steel.

The inserts were allowed to machine 90 crankshafts and the flank wear was measured and compared.

| Cutting data: | |
|---|---|
| Cutting speed: | 220 m/min |
| Feed: | 0.6 mm/rev. |
| Depth of cut: | 3-5 mm |
| Total time in cut: | 27 min. |

The dominating wear mechanism was plastic deformation of the type edge impression causing a flank wear.

| Results: | Flank wear |
|---|---|
| Insert B | 0.2 mm |
| Insert C | 0.2 mm |
| Insert D | 0.6 mm |

The example illustrates the superior resistance to plastic deformation of the inserts B and C produced according to the invention compared to prior art inserts D.

What is claimed is:

1. A method of making a cutting insert comprising a cemented carbide body having a binder phase, with a binder phase enriched surface zone, and a binder phase depleted cutting edge, and a coating, comprising the steps of:

forming a powder mixture containing WC, 2–10 wt. % Co, 4–12 wt. % of cubic carbides of metals from groups 4, 5 or 6 of the periodic table, the binder phase having a CW-ratio of 0.75–0.90;

adding N in an amount of between 0.9 and 1.7% of the weight of the elements from groups 4 and 5;

mixing said powder with a pressing agent;

milling and spray drying the mixture to a powder material;

compacting and sintering the powder material at a temperature of 1300–1500° C., in a controlled atmosphere of sintering gas at 40–60 mbar followed by cooling;

applying post-sintering treatment; and applying a hard, wear resistant coating by CVD- or MT-CVD-technique.

2. The method of claim 1, wherein the powder mixture comprises 2–7 wt. % Co.

3. The method of claim 1, wherein the powder mixture comprises 7–10 wt. % of cubic carbides of the metals from groups 4, 5 or 6 of the periodic table.

4. The method of claim 1, wherein the powder mixture comprises more than 1 wt. % of each Ti cubic carbide, Ta cubic carbide and Nb cubic carbide.

5. The method of claim 1, wherein N is added in an amount between 1.1 and 1.4% of the weight of elements from groups 4 and 5.

6. The method of claim 1, wherein N is added to the powder mixture as carbonitride.

7. The method of claim 1, wherein the N is added during the sintering step as part of the sintering gas atmosphere.

8. The method of claim 1, wherein the sintering is carried out at about 50 mbar.

9. The method of claim 1, wherein the hard, wear resistant coating is a 3–12 μm columnar TiCN layer followed by a 2–12 μm $Al_2O_3$.

10. The method of claim 1, wherein W is added to the powder mixture with the pressing agent, so as to achieve the CW-ratio of 0.75–0.90.

*11. The method of claim 10, wherein W is added to the powder mixture with the pressing agent, so as to achieve the CW-ratio of 0.80–0.85.*

*12. The method of claim 1, wherein the CW-ratio is 0.80–0.85.*

* * * * *